(12) United States Patent
Tamura et al.

(10) Patent No.: US 7,816,766 B2
(45) Date of Patent: Oct. 19, 2010

(54) SEMICONDUCTOR DEVICE WITH COMPRESSIVE AND TENSILE STRESSES

(75) Inventors: Naoyoshi Tamura, Kawasaki (JP); Yosuke Shimamune, Kawasaki (JP); Akiyoshi Hatada, Kawasaki (JP); Akira Katakami, Kawasaki (JP); Masashi Shima, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/131,211

(22) Filed: May 18, 2005

(65) Prior Publication Data

US 2006/0186436 A1  Aug. 24, 2006

(30) Foreign Application Priority Data

Feb. 18, 2005  (JP) .............................. 2005-042870

(51) Int. Cl.
*H01L 29/06* (2006.01)

(52) U.S. Cl. ..................... 257/616; 257/190; 257/192; 257/E21.182; 257/E29.193

(58) Field of Classification Search ................. 257/330, 257/332, 387, 396, E21.182, E29.193, 190, 257/192, 369, 616, 19, 20
See application file for complete search history.

(56) References Cited

U.S. PATENT DOCUMENTS

| | | | | |
|---|---|---|---|---|
| 6,093,618 | A * | 7/2000 | Chen et al. ................... | 438/400 |
| 6,165,826 | A | 12/2000 | Chau et al. | |
| 6,621,131 | B2 | 9/2003 | Murthy et al. | |
| 6,939,814 | B2 * | 9/2005 | Chan et al. ................... | 438/778 |
| 6,982,465 | B2 | 1/2006 | Kamagai et al. | |
| 7,023,018 | B2 * | 4/2006 | Buss ........................... | 257/63 |
| 7,053,400 | B2 * | 5/2006 | Sun et al. ...................... | 257/19 |
| 7,190,036 | B2 * | 3/2007 | Ko et al. ...................... | 257/374 |
| 7,335,959 | B2 * | 2/2008 | Curello et al. .............. | 257/408 |

(Continued)

FOREIGN PATENT DOCUMENTS

JP  8-167718  6/1996

(Continued)

OTHER PUBLICATIONS

Scott E. Thompson et al.; "A 90-nm Logic Technology Featuring Strained-Silicon", IEEE Transactions on Electron Devices, vol. 51, No. 11, Nov. 2004, pp. 1790-1797.

(Continued)

*Primary Examiner*—Eugene Lee
*Assistant Examiner*—Jay C Kim
(74) *Attorney, Agent, or Firm*—Westerman, Hattori, Daniels & Adrian, LLP

(57) ABSTRACT

A semiconductor device includes a gate electrode formed on a silicon substrate in correspondence to a channel region via a gate insulation film, and source and drain regions of p-type formed in the silicon substrate at respective outer sides of sidewall insulation films on the gate electrode, a pair of SiGe mixed crystal regions formed in the silicon substrate at respective outer sides of the sidewall insulation films epitaxially to the silicon substrate so as to be enclosed respectively by the source and drain regions, each of the SiGe mixed crystal regions being grown to a level above a level of a gate insulation film interface between the gate insulation film and the silicon substrate, wherein there is provided a compressive stress film at respective top surfaces of the SiGe mixed crystal regions.

12 Claims, 12 Drawing Sheets

U.S. PATENT DOCUMENTS

| | | |
|---|---|---|
| 2003/0040158 A1* | 2/2003 | Saitoh ................. 438/279 |
| 2003/0080361 A1 | 5/2003 | Murthy et al. |
| 2004/0169221 A1* | 9/2004 | Ko et al. ................. 257/330 |
| 2004/0262683 A1* | 12/2004 | Bohr et al. ................. 257/338 |
| 2005/0035470 A1 | 2/2005 | Ko et al. |
| 2005/0136584 A1* | 6/2005 | Boyanov et al. ............. 438/199 |

FOREIGN PATENT DOCUMENTS

| | | |
|---|---|---|
| JP | 2003-60076 A | 2/2003 |
| JP | 2003-86708 A | 3/2003 |
| JP | 2003-179157 | 6/2003 |
| JP | 2004-31753 | 1/2004 |

OTHER PUBLICATIONS

European Search Report mailed Jul. 4, 2008, issued in corresponding European Application No. 05 01 0736.6-2203.

Japanese Office Action dated Nov. 11, 2008 in corresponding Japanese Patent Application No. 2005-042870.

Thompson, Scott E., et al., "A logic Nanotechnology Featuring Strained-Silicon," IEEE Electron Device Letters, Apr. 2004, pp. 191-193, vol. 25, No. 4.

Japanese Office Action mailed Feb. 10, 2009, issued in corresponding Japanese Application No. 2005-042870.

* cited by examiner

SEMICONDUCTOR DEVICE WITH COMPRESSIVE AND TENSILE STRESSES

CROSS-REFERENCE TO RELATED APPLICATION

The present application is based on Japanese priority application No. 2005-042870 filed on Feb. 18, 2005, the entire contents of which are hereby incorporated by reference.

BACKGROUND OF THE INVENTION

The present invention generally relates to semiconductor devices and more particularly to a semiconductor device having improved operational speed with application of stress and a fabrication method of such a semiconductor device.

With progress in the art of device miniaturization, it is now becoming possible to realize ultrafine and ultra fast semiconductor devices having a gate length of 100 nm or less.

With such ultrafine and ultra fast transistors, the area of the channel region right underneath the gate electrode is much smaller than conventional semiconductor devices, and thus, the mobility of electrons or holes traveling through the channel region is influenced heavily by the stress applied to such a channel region.

Thus, various attempts have been made for optimizing the stress applied to the channel region in the prospect of improving the operational speed of the semiconductor device further.

In semiconductor devices that use a silicon substrate as a channel region, the mobility of holes is generally smaller than the mobility of electrons, and thus, it is particularly important to improve the operational speed of p-channel MOS transistors, in which holes are used for the carriers, in the designing of semiconductor integrated circuits.

With such p-channel MOS transistors, it is known that the mobility of carriers is improved by applying a uniaxial compressive stress to the channel region, and there is a proposal to use the construction of FIG. 1 as the means of applying the compressive stress to the channel region.

Referring to FIG. 1, there is formed a gate electrode 3 on a silicon substrate 1 via a gate insulation film 2, and p-type diffusion regions 1a and 1b are formed in the silicon substrate 1 at both lateral sides of the gate electrode 3 so as to define the channel region. Further, sidewall insulation films 3A and 3B are formed on the sidewall surfaces of the gate electrode 3 so as to cover also a surface part of the silicon substrate 1.

Thereby, the diffusion regions 1a and 1b function respectively as a source extension region and a drain extension region of the MOS transistor, and the flow of the holes transported through the channel region right underneath the gate electrode 3 from the diffusion region 1a to the diffusion region 1b is controlled by the gate voltage applied to the gate electrode 3.

Further, there are formed SiGe mixed crystal regions 1A and 1B in the silicon substrate 1 in the construction of FIG. 1 at respective outer sides of the sidewall insulation films 3A and 3B with epitaxial relationship with the silicon substrate 1, and p-type source 1c and drain 1d regions are formed in the SiGe mixed crystal regions 1A and 1B respectively in continuation from the diffusion region 1 a and the diffusion region 1b.

Because the SiGe mixed crystal regions 1A and 1B have a lattice constant larger than that of the silicon substrate 1 in the MOS transistor of the construction of FIG. 1, the SiGe mixed crystal regions 1A and 1B are applied with a compressive stress as shown in FIG. 1 by an arrow a, and as a result, the SiGe mixed crystal regions 1A and 1B undergo deformation in the direction generally perpendicular to the surface of the silicon substrate 1 as shown by an arrow b.

Because the SiGe mixed crystal regions 1A and 1B are thus formed epitaxially on the silicon substrate 1, such a deformation of the SiGe mixed crystal regions 1A and 1B represented by the arrow b induces a corresponding deformation in the channel region of the silicon substrate as represented by an arrow c, while such a deformation in the channel region induces a uniaxial compressive stress in the channel region as represented by an arrow d.

As a result of such a uniaxial compressive stress applied to the channel region of the MOS transistor of FIG. 1, the symmetry of the Si crystal constituting the channel region is locally modulated, and as a result of such local modulation of the symmetry, degeneration of heavy holes and light holes in the valence band is resolved. Thereby, there is caused increase of hole mobility in the channel region, leading to improvement of operational speed of the transistor.

It should be noted that such increase of hole mobility caused in the channel region by locally induced stress appears particularly conspicuously in the ultrafine semiconductor devices having a gate length of 100 nm or less.

FIG. 2 shows the construction of a p-channel MOS transistor based on such a principle and described in Non-Patent Reference 1. In the drawing, those parts corresponding to the parts described previously are designated by the same reference numerals and the description thereof will be omitted.

Referring to FIG. 2, the SiGe mixed crystal regions 1A and 1B are formed epitaxially so as to fill the respective trenches formed in the silicon substrate 1 up to the level higher than the interface between the silicon substrate 1 and the gate electrode 2 represented in the drawing by a dotted line L, Further, it should be noted that the mutually facing side surfaces 1As and 1Bs of the SiGe mixed crystal regions 1A and 1B are formed to have a curved shape such that the distance between the SiGe mixed crystal regions 1A and 1B increases continuously in the downward direction of the silicon substrate 1 from the lower surface of the gate insulation film 2.

Further, in the conventional construction of FIG. 2 in which the SiGe mixed crystal regions 1A and 1B grown to the level higher than the foregoing level L are formed directly with a silicide layer 4. A similar silicide layer 4 is formed also on the polysilicon gate electrode 3.

REFERENCES (Patent Reference 1) U.S. Pat. No. 6,621,131

(Patent Reference 2) Japanese Laid-Open Patent Application 2004-31753

(Patent Reference 3) Japanese Laid-Open Patent Application 8-167718

(Patent Reference 4) Japanese Laid-Open Patent Application 2003-179157

(Non-Patent Reference 1) Thompson, S. E., et al., IEEE Transactions on Electron Devices, vol. 51, No. 11, November, 2004, pp. 1790-1797

SUMMARY OF THE INVENTION

The present invention provides a construction of such a p-channel MOS transistor having a stressed channel region wherein the stress of the channel region can be increased further.

In a first aspect, the present invention provides a semiconductor device, comprising:

a silicon substrate defined with a device region by a device isolation region and including a channel region in said device region;

a gate electrode formed on said silicon substrate in correspondence to said channel region via a gate insulation film, said gate electrode carrying a pair of sidewall insulation films respectively on a pair of mutually opposing sidewall surfaces thereof;

source and drain extension regions of p-type formed in said silicon substrate at respective lateral sides of said gate electrode across said channel region;

source and drain regions of p-type formed in said silicon substrate at respective outer sides of said sidewall insulation films respectively in continuation with said source extension region and said drain extension region; and a pair of SiGe mixed crystal regions formed in said silicon substrate at respective outer sides of said sidewall insulation films epitaxially to said silicon substrate so as to be enclosed respectively by said source region and said drain region, each of said SiGe mixed crystal regions being grown to a level above a level of a gate insulation film interface between said gate insulation film and said silicon substrate, wherein there is provided a compressive stress film at respective top surfaces of said pair of SiGe mixed crystal regions.

According to the present invention, the SiGe mixed crystal region is compressed in a plane parallel to said silicon substrate in a direction perpendicular to a channel direction defined as a direction connecting said source region and said drain region, by providing such a compressive stress film on the respective top surfaces of the SiGe mixed crystal regions, and as a result, each of the SiGe mixed crystal regions undergoes dilatation in the foregoing channel direction, while such a dilatation of the SiGe mixed crystal regions in the channel direction causes compression of the channel region also in the channel direction. With this, the compressive stress applied to the channel region by the SiGe mixed crystal regions according to the mechanism explained with reference to FIG. 1 is enhanced further, and the hole mobility in the channel region is improved further. Thereby, it should be noted that, because there is formed a device isolation structure at the outer side of the SiGe mixed crystal region in the channel direction, the dilation of the SiGe mixed crystal region in the outer direction, and hence in the direction away from the channel direction, is substantially blocked by such a device isolation structure, and the dilatation of the SiGe mixed crystal regions is caused only in the direction toward the channel region.

Thereby, it should be noted that such a compressive stress film, when formed on the sidewall surface of the SiGe mixed crystal region, causes compression of the SiGe mixed crystal regions in the vertical direction to the substrate with the contraction of the compressive film, and thus, the dilatational deformation of the channel region in the vertical direction shown in FIG. 1 by the arrow c is diminished. Thereby, the magnitude of the compressive stress d shown in FIG. 1 caused with such a dilatational deformation of the channel region is decreased.

Thus, with the present invention, a tensile stress film is formed on the sidewall surfaces of the SiGe mixed crystal regions for reducing the compressive stress acting to the SiGe mixed crystal layer perpendicularly to the substrate surface. Further, a similar tensile stress film is formed on the sidewall surfaces of the gate electrode such that the tensile stress film urges the gate electrode to the channel region from the upward direction. Thereby, the compressive stress formed in the channel region in the up and down directions is reduced.

Further, according to the present invention, the thickness of the tensile stress film formed along the device isolation trench of the device isolation structures provided at the right and left of the channel region is increased in the part located adjacent to the channel region. With this, it becomes possible to decrease the compressive stress applied laterally to the channel region by the device isolation insulator filling the device isolation trenches at the right and left part of the channel region in the direction toward the channel region. Thereby, the dilatation of the channel region in the foregoing lateral directions by the compressive stress applied to the channel region by the pair of SiGe mixed crystal regions at both end parts of the channel region in the channel direction is enhanced. Thus, the improvement of hole mobility by the compressive stress d explained with reference to FIG. 1 is enhanced further.

Other objects and further features of the present invention will become apparent from the following detailed description when read in conjunction with the attached drawings.

DETAILED DESCRIPTION OF THE INVENTION

Figure 3:
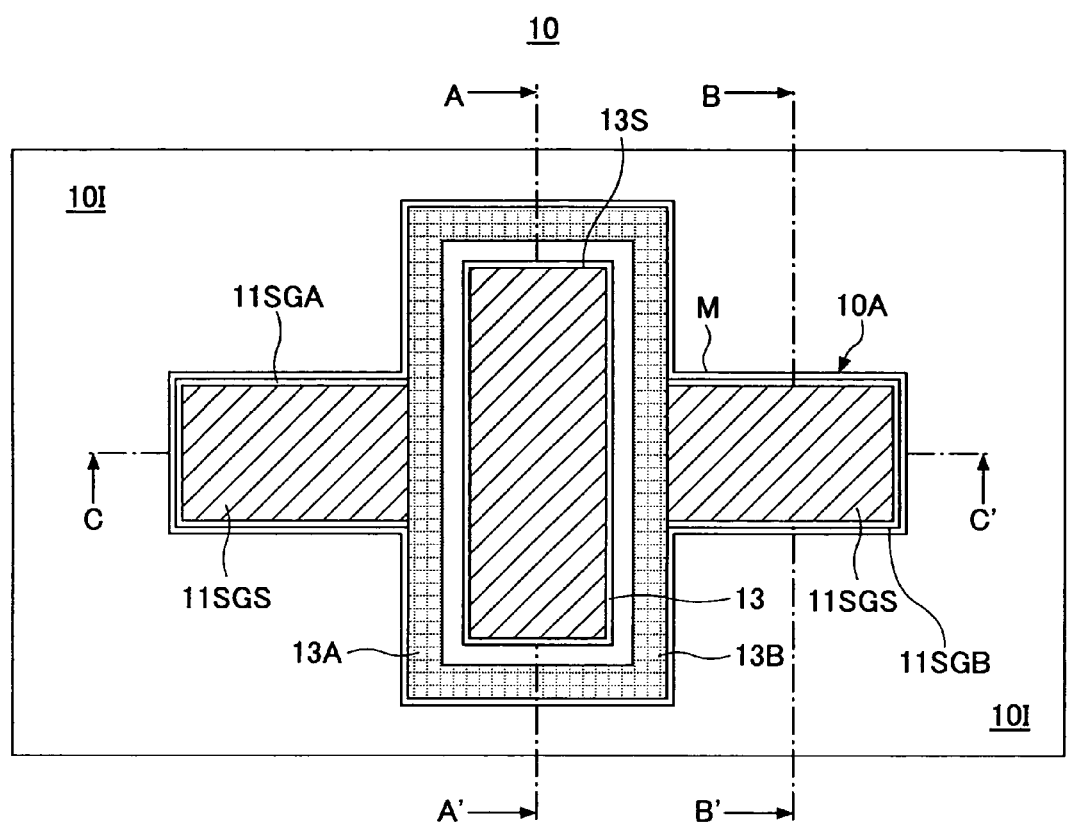
FIG. 3 is a plan view diagram showing the construction of a p-channel MOS transistor according to an embodiment of the present invention.
Figure 4A:
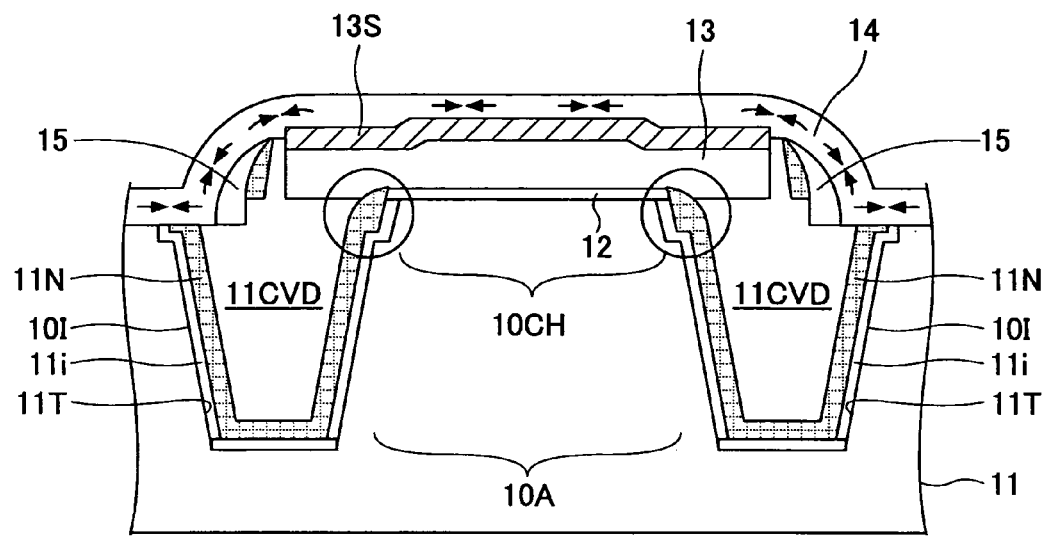
FIGS. 4A-4C are diagrams showing the construction of the p-channel MOS transistor of FIG. 3 in a cross-sectional view.
Figure 4B:
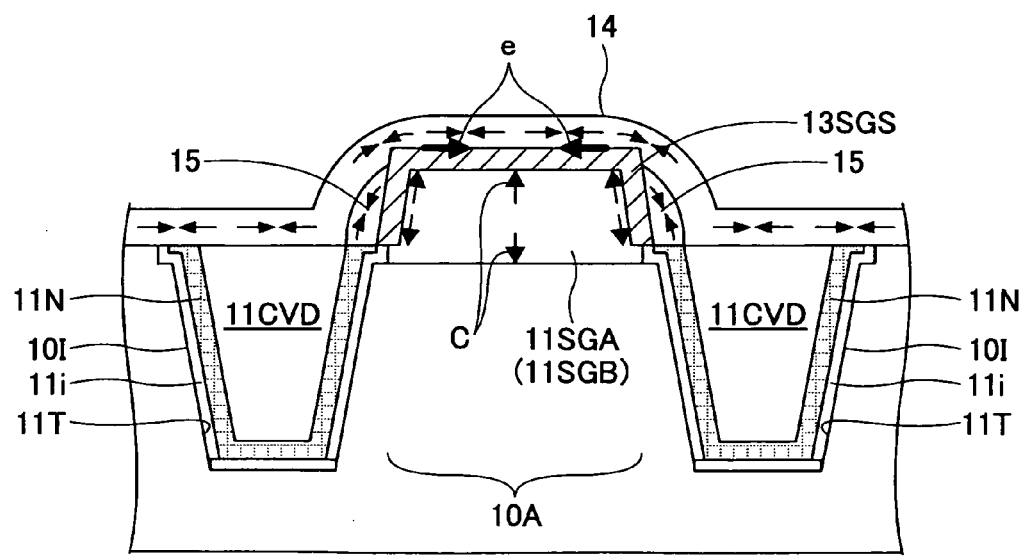

FIG. 3 shows the overall construction of a p-channel MOS transistor 10 according to an embodiment of the present invention in a plan view, while FIGS. 4A and 4B show the p-channel MOS transistor 10 in a cross-sectional view respectively taken along a line A-A' and a B-B' of FIG. 3. Further, FIG. 4C shows the p-channel MOS transistor 10 in a cross-sectional view taken along a line C-C' of FIG. 3.

Figure 4C:
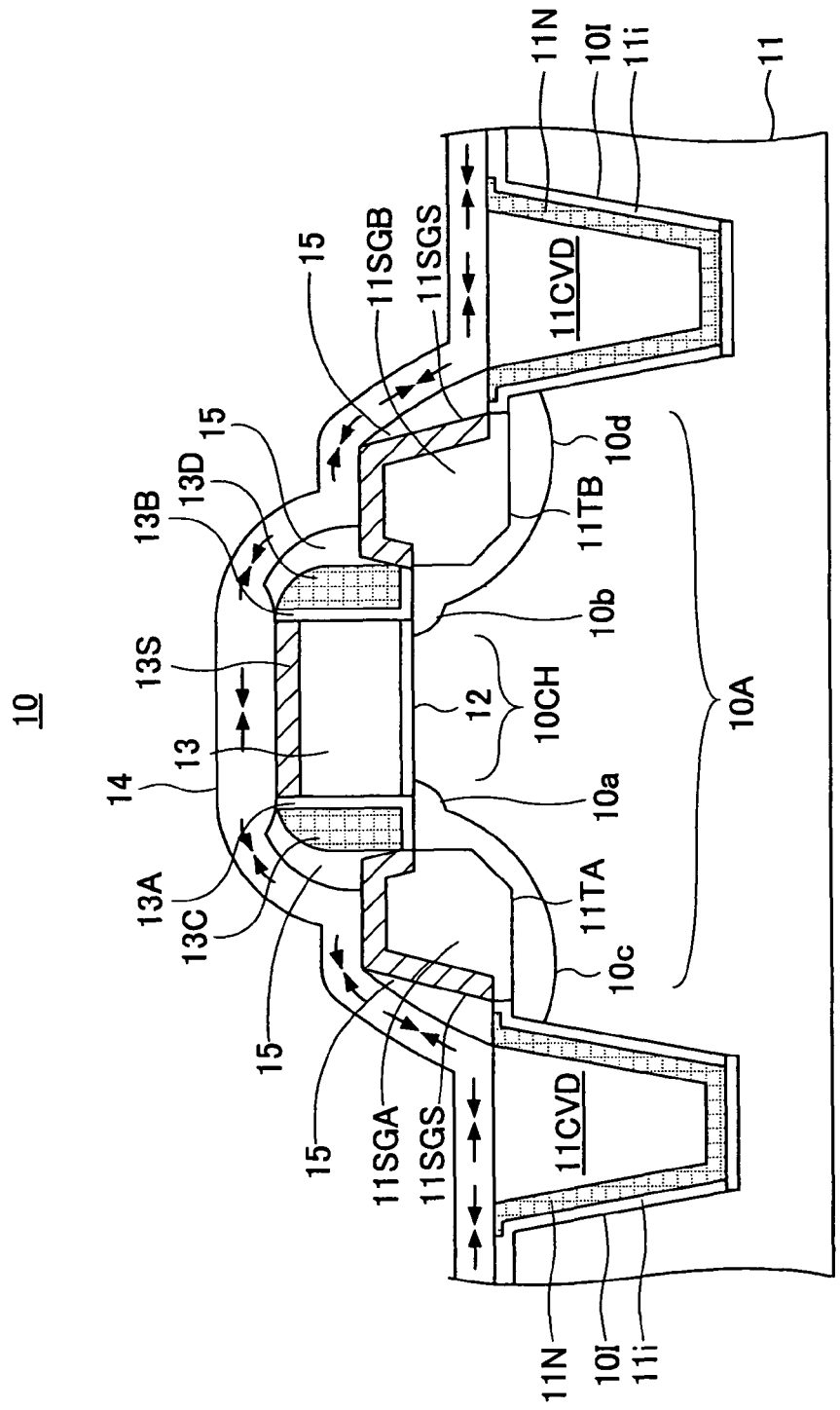

Referring to FIG. 3 and further to FIGS. 4A-4C, the p-channel MOS transistor 10 is formed on a silicon substrate 11 having a device region 10A of $n^-$-type defined by an STI device isolation structure 10I, wherein the device region 10A includes therein a channel region 10CH of the p-channel MOS transistor 10. Further, the device region 10A projects upward with respect to the surrounding device isolation region 10I and forms a mesa structure M as shown in FIG. 3 by a thick line.

Thereby, the device isolation structure 10I includes a device isolation trench 11T formed in the silicon substrate 11 and a thermal oxide liner film 11$i$ is formed on the surface of the device isolation trench 11T, wherein the void inside the thermal oxide liner film 11$i$ is filled with a CVD oxide film 11CVD via an SiN liner film 11N accumulating therein a tensile stress and formed on the thermal oxide liner film 11i. The feature of the device isolation structure 10I of the present invention will be explained later in detail with reference to latter embodiment.

Referring to FIG. 4C, in particular, there is formed a polysilicon gate electrode 13 of p$^+$-type on the channel region 10CH via a gate insulation film 12 typically of SiON having a thickness of about 1.2 nm, and source and drain extension regions 10a and 10b of p-type are formed in the silicon substrate 11 adjacent to respective sidewall surfaces of the polysilicon gate electrode 13 such that the source and drain extension regions 10a and 10b are aligned in the channel direction.

Further, the polysilicon gate electrode 13 carries, on the respective sidewall surfaces thereof, CVD oxide films 13A and 13B typically having a thickness of 10 nm, wherein the CVD oxide films 13A and 13B continues to extend and cover the surface of the silicon substrate 11 exposed in the device region 10A. Further, there are formed SiN sidewall insulation films 13C and 13D at respective outer sides of the CVD oxide films 13A and 13B. Further, source and drain regions 10c and 10d of p$^+$-type are formed in the silicon substrate 11 in correspondence to respective outer edges of the SiN sidewall insulation films 13C and 13D.

Further, the mesa structure M constituting the device region 10A is subjected to an etching process combining a dry etching process and a wet etching process, at respective outer edges of the SiN sidewall insulation films 13C and 13D, such that the etching does not proceed beyond the source and drain regions 10c and 10d. Thereby, there are formed trenches 11TA and 11TB such that each of the trenches 11TA and 11TB is defined by plural Si crystal surfaces and is included in the source region 10c or drain region 10d.

Further, p-type SiGe mixed crystal regions 11SGA and 11SGB containing Ge with a concentration of preferably 20% or more, are formed epitaxially to the silicon substrate 11 such that the SiGe mixed crystal regions 11SGA and 11SGB fill the trenches 11TA and 11TB respectively and form a part of the source and drain regions 10c and 10d. It should be noted that such SiGe mixed crystal epitaxial regions 11SGA and 11SGB can be formed by a low-pressure CVD process that uses SiH$_4$ and GeH$_4$ gases as the gaseous source at the substrate temperature of 400-550° C. while supplying the SiH$_4$ gas and the GeH$_4$ gas to a processing vessel with respective partial pressures of 1-10 Pa and 0.1-10 Pa, together with an HCl etching gas supplied with a partial pressure of 1-10 Pa.

In the example of FIGS. 4A-4C, it should be noted that the SiGe mixed crystal regions 11SGA and 11SGB are formed to project beyond the interface between the silicon substrate 11 and the gate insulation film 12 in the upward direction at least with a distance of 20 nm.

It should be noted that the SiGe mixed crystal regions 11SGA and 11SGB thus formed are defined by crystal surfaces, wherein that the sidewall surface at the side of the gate electrode 13 is defined by an inclined surface such as a Si(111) surface formed such that the distance from the sidewall surface of the gate electrode increases in the upward direction. Further, the sidewall surface of the SiGe mixed crystal region 11SGA or 11GB opposite to the foregoing inclined sidewall surface is formed adjacent to the device isolation structure 10I and forms the sidewall surface of the mesa structure M.

While such p-type SiGe mixed crystal regions 11SGA and 11SGB can be formed by introducing a p-type impurity element by an ion implantation process after the epitaxial growth, it is more preferable to add a gas containing a p-type element such as diborane as a doping gas at the time of the epitaxial growth.

Further, by forming the source and drain regions 11c and 11d of p$^+$-type immediately after formation of the trenches 11TA and 11TB but before the formation of the SiGe mixed crystal regions 11SGA and 11SGB, it becomes possible to prevent direct contact of the p-type SiGe mixed crystal region 11SGA or 11SGB having a small bandgap with the device region 10A formed of the n-type Si crystal, and it becomes possible to suppress occurrence of junction leakage current at the p-n junction interface.

On the top surface of the gate electrode 13, there is formed a nickel silicide film 13S by a salicide process that uses a metallic Ni film, and nickel germanium silicide (NiGeSi) layers 11SGS are formed on the p-type SiGe mixed regions 11SGA and 11SGB also by a salicide process that uses a metallic Ni film.

Further, in the present embodiment, it should be noted that there is formed a compressive stress film 14 itself having a tendency of causing shrinkage so as to cover the entirety of the p-channel MOS transistor as shown in FIGS. 4A-4C.

With formation of such a compressive stress film 14, the SiGe mixed crystal regions 11SGA and 11SGB constituting a part of the source and drain regions of p$^+$-type experience a compressive stress within the plane of the silicon substrate in the direction perpendicular to the channel direction at both ends of the channel region as indicated in FIG. 4B by an arrow e, and as a result, the SiGe mixed crystal regions 11SGA and 11SGB are deformed to cause dilatation in the channel direction.

Figure 1:
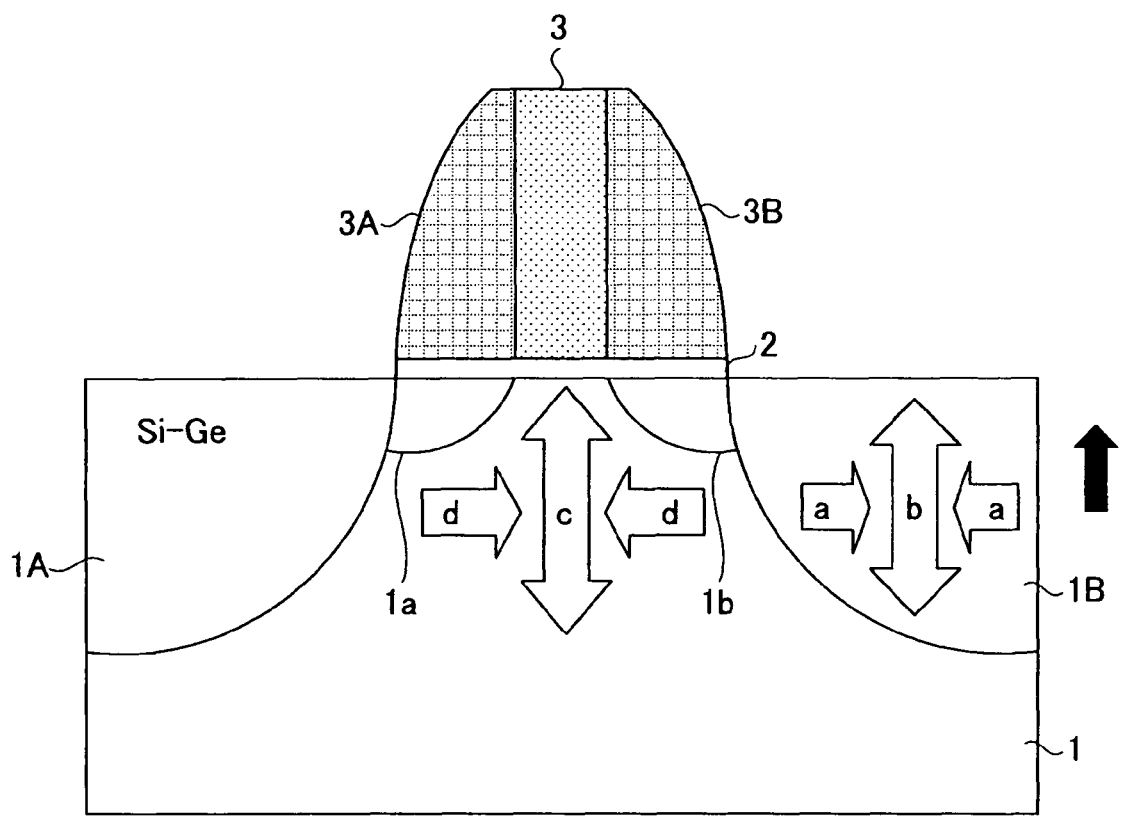
FIG. 1 is a diagram showing the principle of a semiconductor device that uses an SiGe mixed crystal layer as a compressive stress source.
Figure 2:
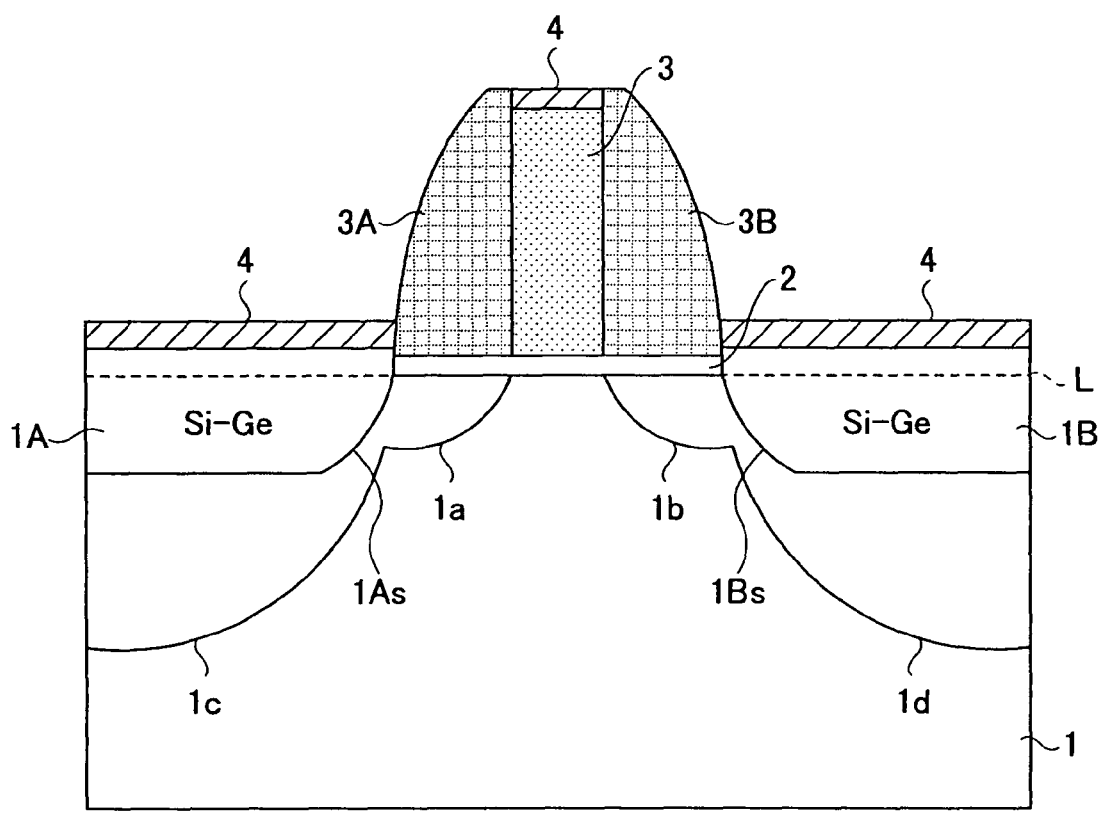
FIG. 2 is a diagram showing the construction of a conventional semiconductor device that uses a SiGe mixed crystal layer as the compressive stress source.

Thereby, as can be seen from the cross-sectional view of FIG. 4C, the respective outer ends of the SiGe mixed crystal regions 11SGA and 11SGB are pinned substantially by the device isolation structure 10I, and thus, such deformation of the SiGe mixed crystal regions 11SGA and 11SGB induce a compressive stress primarily in the channel region 10CH. Thereby, the compressive stress d explained with reference to FIG. 1 is enhanced further.

Preferably, such a compressive stress film 14 accumulates a stress of 1.5 GPa or more in the absolute value, while it should be noted that such a compressive film 14 can be formed for example by forming an SiN film with the thickness of 80 nm at the substrate temperature of 400° C. under the pressure of 250 Pa while supplying SiH$_4$ and NH$_3$ as gaseous sources with respective flow rates of 600 SCCM and 1400 SCCM. The compressive stress film 14 may also contain oxygen.

On the other hand, with reference to FIG. 4B, it will be noted that such a compressive stress film 14, when formed on a surface forming an angle with respect to the substrate surface such as the sidewall surface of the SiGe mixed crystal region 11SGA or 11SGB, acts to press down the SiGe mixed crystal regions 11SGA or 11SGB toward the silicon substrate 11.

When this occurs, the dilatation of the SiGe mixed crystal regions 11SGA or 11SGB, which in turn causes the compressive stress in the channel region as explained with reference to FIG. 1 (see the arrow c in FIG. 4B), is prevented or diminished, and as a result, the magnitude of the horizontal compressive stress d applied to the channel region in the channel direction is decreased.

Thus, with the present embodiment, a tensile stress film 15, which shows the tendency of expansion, is formed locally on the surface forming an angle with respect to the substrate surface, such that the compressive stress of the compressive stress film 14 acting on such a surface is canceled out at least partially. It should be noted that such a tensile stress film is formed also at the outer sides of the sidewall insulation films 13A and 13B at the sidewall surfaces of the gate electrode 13.

With this, the problem of the gate electrode 13 causing pressing of the channel region 10CH from above with the compressive stress of the compressive stress film 14, resulting in decrease in the magnitude of the compressing stress d acting in the horizontal direction of FIG. 1, is successfully avoided.

It is preferable that such a tensile stress film 15 accumulates therein a stress of 1 GPa or more in the magnitude wherein such a tensile stress film 15 can be formed for example by forming an SiN film having a thickness of 100 nm at the substrate temperature of 500° C. under the pressure of $3 \times 10^4$ Pa while using $SiH_4$ and $NH^3$ with respective flow rates of 200 SCCM and 700 SCCM as the gaseous sources, followed by an etch back process of the same.

As a result of the foregoing construction, a compressive stress of the magnitude reaching 0.9 GPa is applied to the channel region 10CH in the channel direction, and with this, the saturation current of the p-channel MOS transistor per gate width has increased from the value of 600 µA/µm for the case no such a compressive film 14 and the tensile film 15 are provided, to the value of 640 µA/µm.

Figure 5:
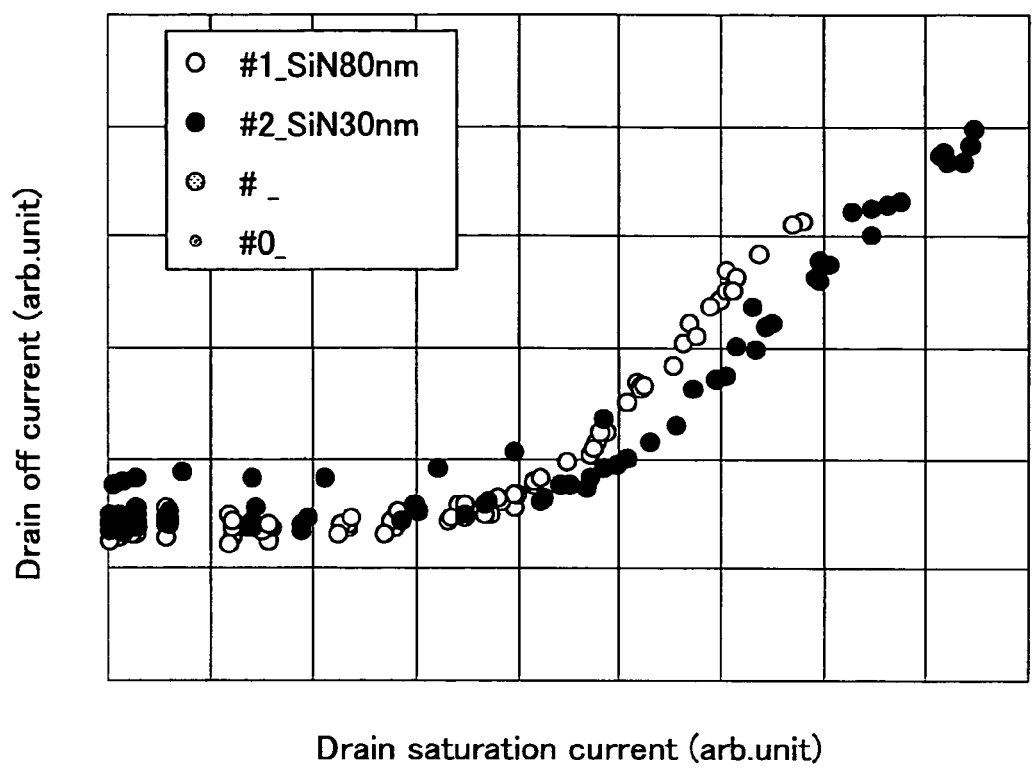
FIG. 5 is a diagram showing the characteristics of the p-channel MOS transistor of FIG. 3.

On the other hand, in the case the thickness of the tensile stress film 15 is increased beyond 80 nm, there occurs an increase in the drain-Off current as shown in FIG. 5. Here, it should be noted that FIG. 5 shows the relationship between the drain-Off current and the drain saturation current for the case the gate length and the gate width are respectively set to 40 nm and 500 nm, an SiN film having a thickness of 50 nm and accumulating a compressive stress of 1.0 GPa being used for the compressive stress film 14, and an SiN film accumulating a tensile stress of 1.5 GPa being used for the tensile stress film 15, wherein the thickness of the tensile stress film 15 is changed variously.

From FIG. 5, it is concluded that the thickness of the tensile stress film 15 is set preferably to 80 nm or less.

Figure 6:
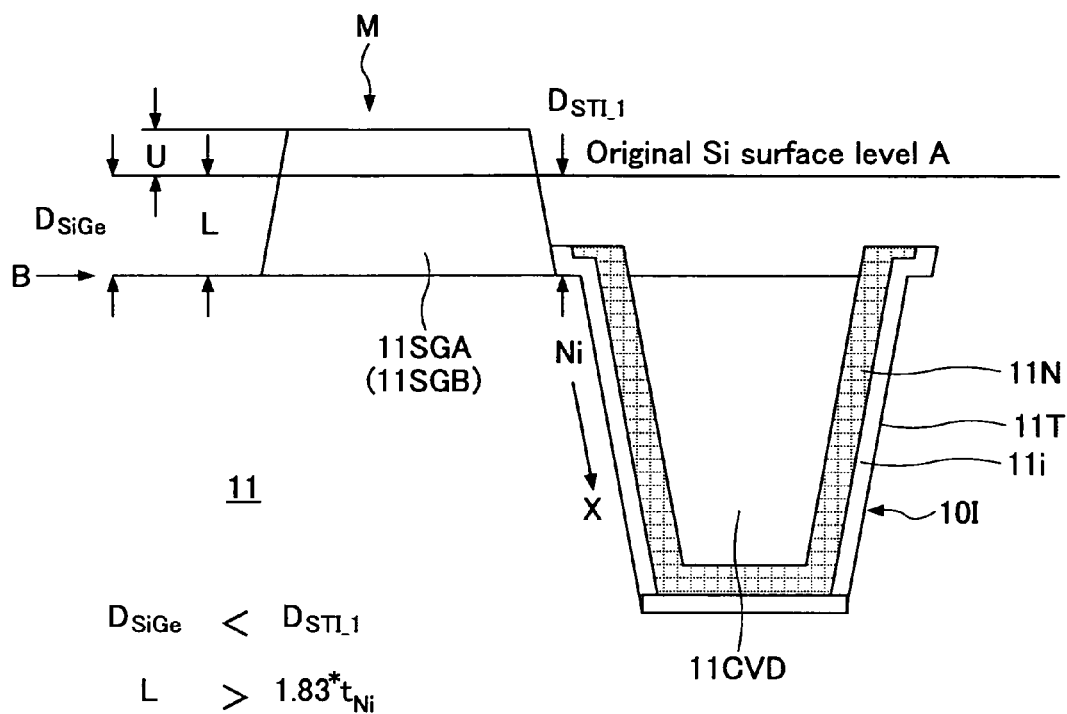
FIG. 6 is a diagram explaining another feature of the p-channel MOS transistor of FIG. 3.

FIG. 6 is another diagram showing the construction of the p-channel MOS transistor 10, wherein it should be noted that FIG. 6 corresponds to the cross-section of FIG. 4B. Further, "original Si surface level" in FIG. 6 represents the interface A between the silicon substrate 11 and the gate insulation film 12 in FIG. 4C.

Referring to FIG. 6, the SiGe mixed crystal region 11SGA or 11SGB constituting a part of the mesa M of FIG. 3 starts the growth from a level B lower than the interface A by the depth $D_{SiGe}$ with the formation of the trench 11TA or 11TB, wherein the growth continues to the height U beyond the foregoing interface A. Thereby, it is preferable to set the height U beyond 20 nm in order to apply the compressive stress d to the channel region 10CH with sufficient magnitude according to the mechanism explained with reference to FIG. 1. Further, while the device isolation structure 10I is formed in the present embodiment at the level lower than the interface A with the depth $D_{STI\_1}$, it is preferable that the depth $D_{STI\_1}$ satisfies the relationship $D_{SiGe}<D_{STI\_1}$, such that the height of the CVD oxide film 11CVD in the device isolation structure 10I does not exceed the level B.

By setting the positional relationship like this, it is possible to avoid the problem of deterioration of the device isolation characteristics caused, in the case a Ni metallic film is deposited on the SiGe mixed crystal 11SGA or 11SGB for formation of the silicide film 11SGS, by the Ni atoms in the Ni metallic film cause diffusion deeply into the thermal oxide film 11i constituting the device isolation structure 10I through the SiGe mixed crystal regions 11SGA or 11SGB.

Further, in the present embodiment, it should be noted that the top part of the SiN film 11N constituting the device isolation structure 10I has an increased film thickness at the right and left portions of the channel region 10CH as circled in the drawing as shown in the cross-sectional diagram of FIG. 4A.

Referring to FIG. 4A, it should be noted that there is applied a compressive stress in the cross-sectional diagram of FIG. 4A in the direction perpendicular to the plane of the drawing by the SiGe mixed crystal regions 11SGA and 11SGB located above and below the plane of FIG. 4A. Now, in order that the increase of hole mobility occurs efficiently in the channel region with such a compressive stress, it is necessary that the Si crystal causes deformation in correspondence to the channel region 10CH in the lateral direction in the plane of FIG. 4A.

On the other hand, in the device isolation structure 10I disposed at the right and left of the channel region 10CH, the CVD oxide film 11CVD, formed by a high-density plasma CVD process, accumulates therein a compressive stress, and as a result, the channel region 10CH is subjected to a compressive stress resisting the desired deformation thereof, from the device isolation structures 10I disposed at the right and left of the channel region 10CH.

While such a compressive stress caused by the CVD oxide film 11CVD can be canceled out to some extent by accumulating a counter-acting tensile stress in the SiN film 11N formed in the device isolation structure 10I, the present embodiment suppresses this undesirable compressive stress, caused by the CVD oxide film 11CVD, by increasing the thickness of the SiN film 11N locally at the lateral edges of the channel region 10CH as circled in FIG. 4A.

Figure 7A:
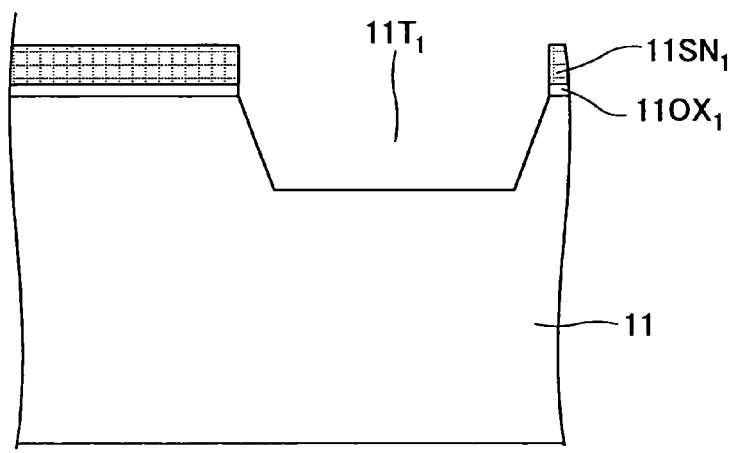
FIGS. 7A-7I are diagrams showing the formation process of a device isolation structure in the p-channel MOS transistor of FIG. 3.
Figure 7B:
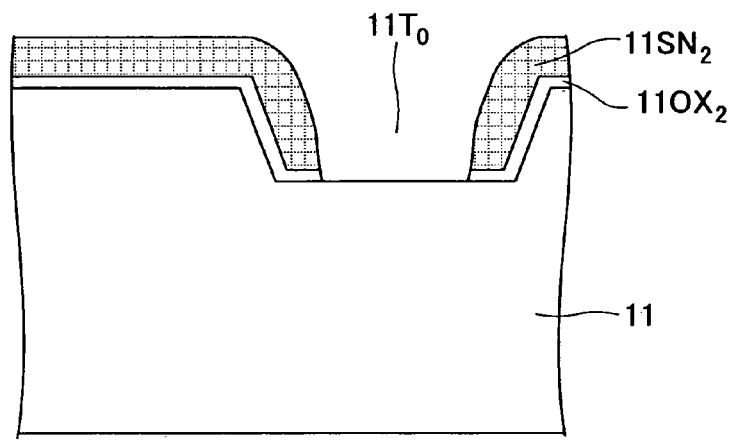
Figure 7C:
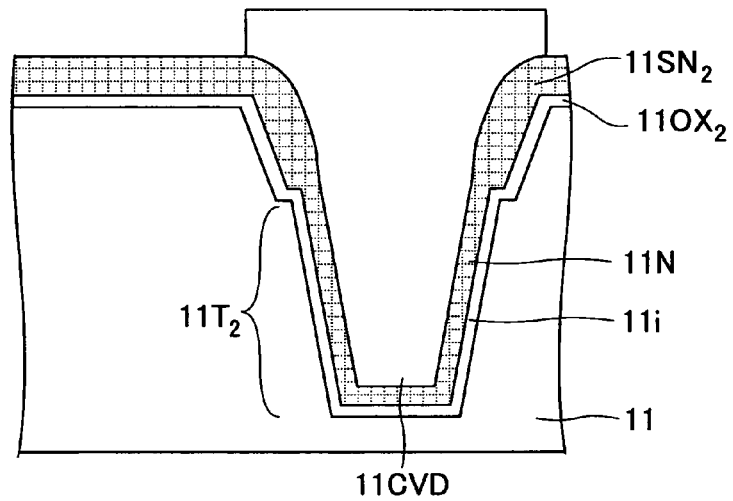
Figure 7D:
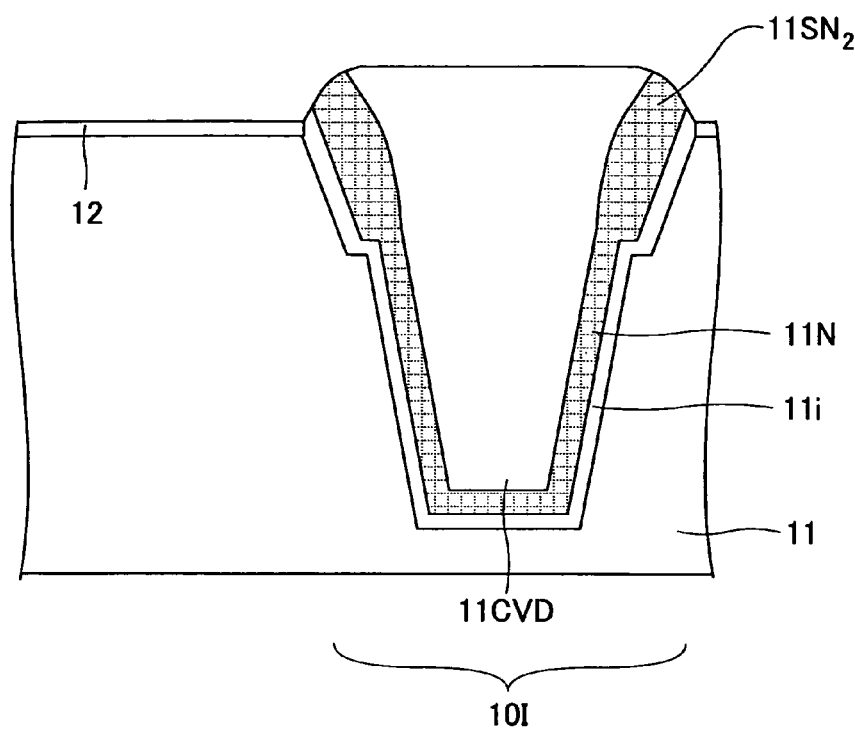
Figure 7E:
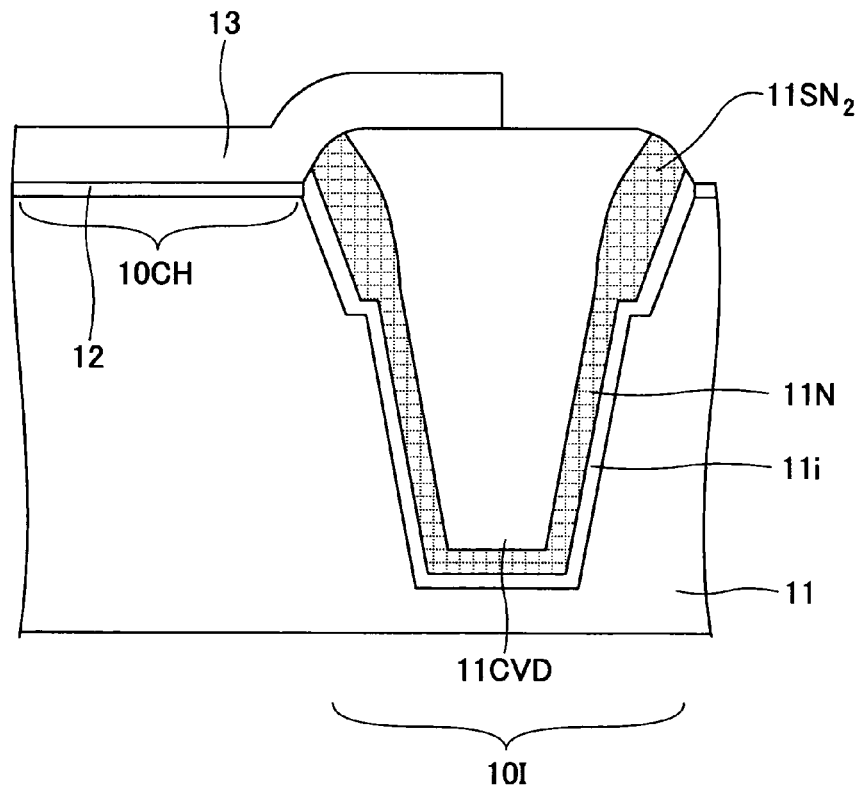
Figure 7F:
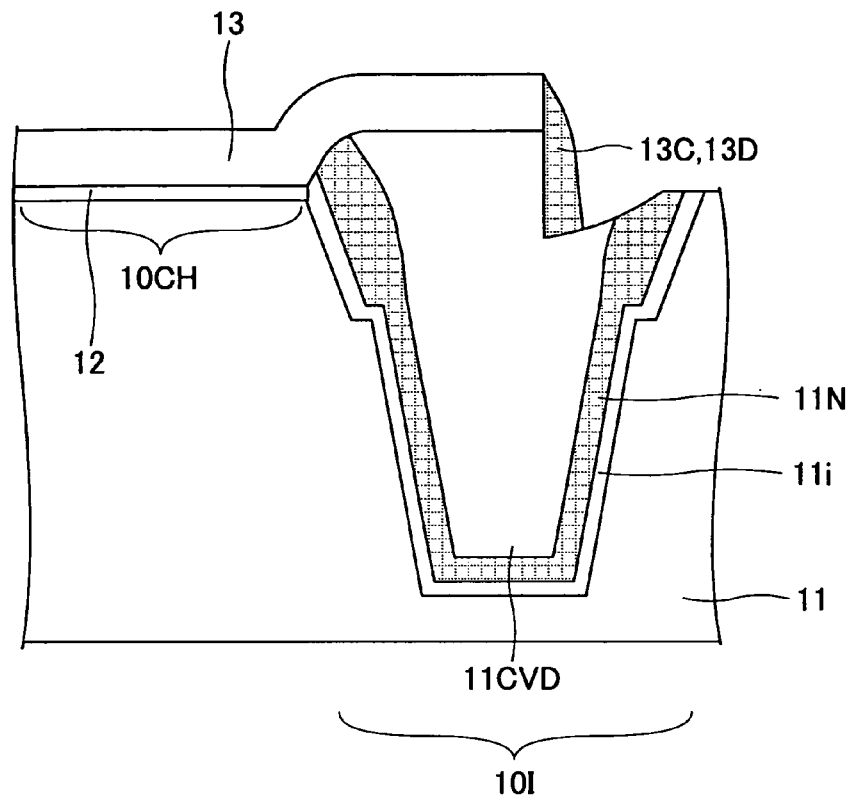
Figure 7G:
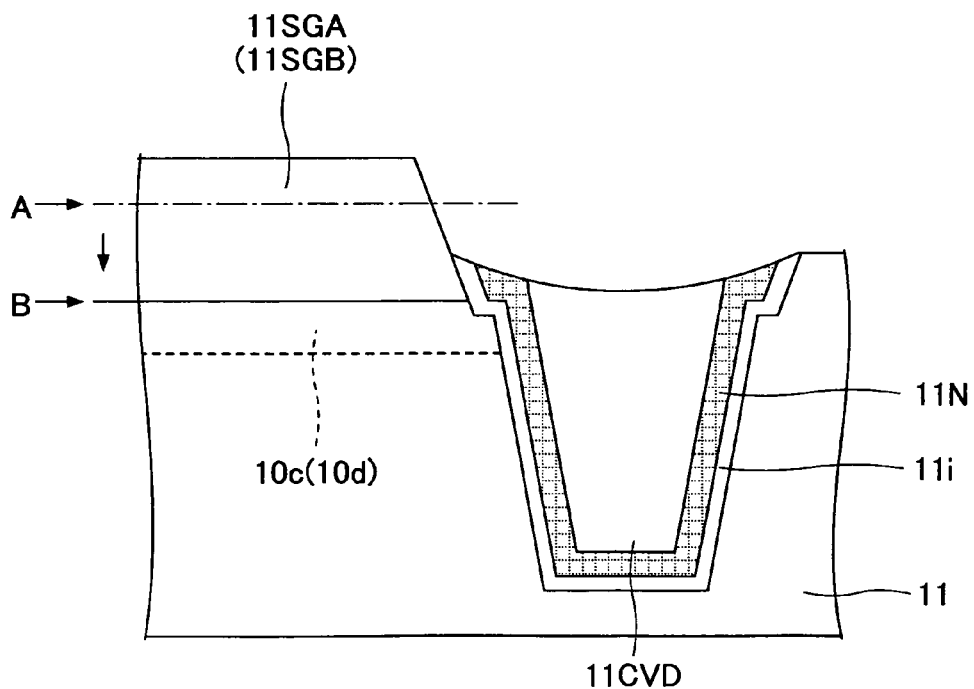
Figure 7H:
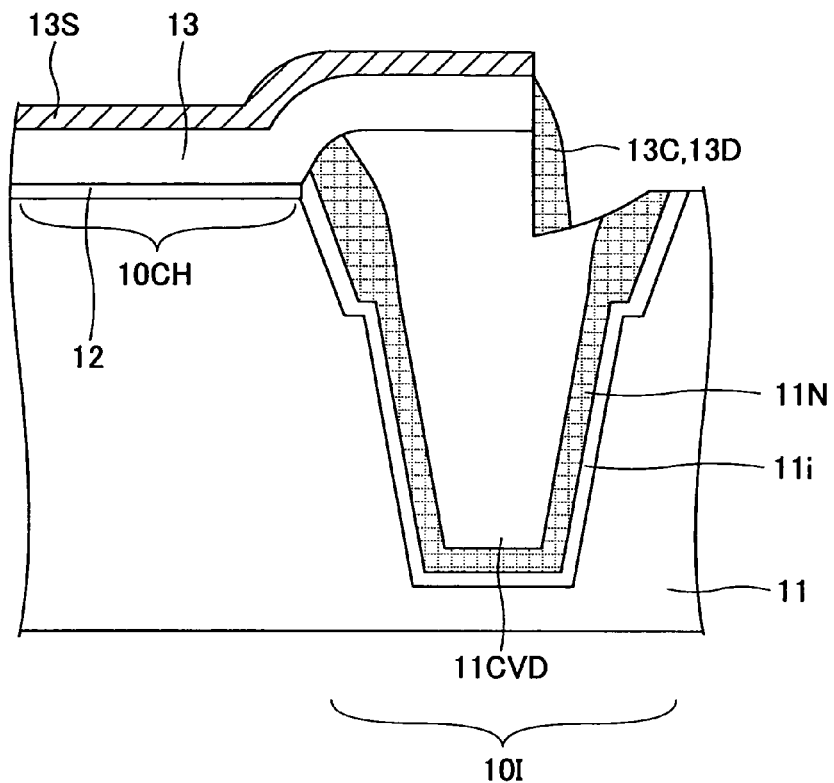
Figure 7I:
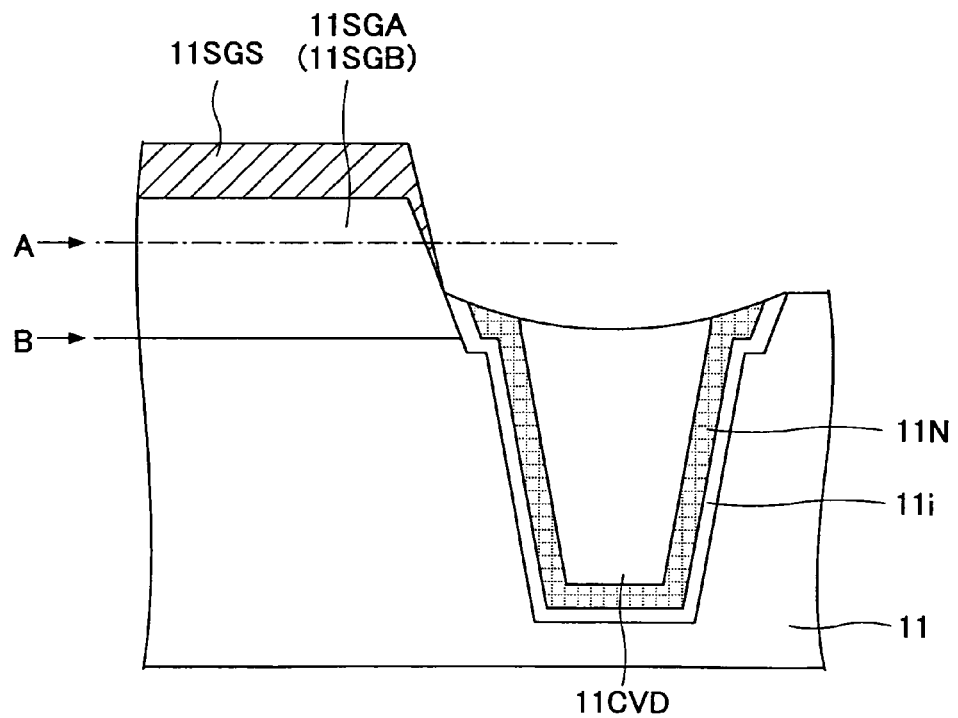

FIGS. 7A-7I are diagrams showing the fabrication process of the p-channel MOS transistor 10 of the present invention including the formation step of the device isolation structure 10I, wherein FIGS. 7A-7F and FIG. 7H represent the A-A' cross-section of FIG. 3, while FIGS. 7G and 7I represent the B-B' cross-section of FIG. 3.

Referring to FIG. 7A, there is formed a first, shallow device isolation trench $11T_1$ in the silicon substrate 11 in correspondence to the region where the device isolation structure 10I is to be formed by a dry etching process while using an SiN film 11 $SN_1$ formed on the silicon structure 11 via a thermal oxide film $11OX_1$ as a mask, and, after removing the SiN film $11SN_1$ and the thermal oxide film $11OX_1$, a new thermal oxide film $11OX_2$, and a new SiN film $11SN_2$ are formed in the step of FIG. 7B, wherein there is formed a self-aligned opening 11To in the device isolation trench $11T_1$ in the step of FIG. 7B by etching back the SiN film $11SN_2$ and the underlying thermal oxide film $11OX_2$.

Further, in the step of FIG. 7C, the silicon substrate 11 is subjected to a dry etching process in the foregoing opening 11To while using the SiN film $11SN_2$ as a mask, and a second device isolation trench $11T_2$ is formed in the first device isolation trench $11T_1$ such that the second device isolation trench $11T_2$ extends into the silicon substrate 11. Thereby, the first and second device isolation trenches $11T_1$ and $11T_2$ form the device isolation trench 11T.

Further, in the step of FIG. 7C, a thermal oxide film 11i and a CVD SiN film 11N are formed on the surface of the device isolation trench 11T thus formed, and the CVD oxide film 11CVD is deposited on the SiN film 11N by a high-density plasma CVD process. Further, the CVD oxide film 11CVD is patterned such that the CVD oxide film 11CVD is removed from the surface of the silicon substrate 11 except for the part thereof filling the device isolation trench 11T.

Further, in the step of FIG. 7D, the SiN film 11SN$_2$ and the thermal oxide film 11OX$_2$ are removed by a CMP process, and the CVD oxide film 11CVD is planarized. Further, a high-quality SiON gate insulation film 12 is formed on the newly exposed surface of the silicon substrate 11.

Further, in the step of FIG. 7E, a polysilicon film is deposited on the gate insulation film 12, and the polysilicon gate electrode 13 is formed as a result of the patterning of such a polysilicon film.

Further, in the step of FIG. 7F, sidewall insulation films 13A and 13B (not shown) of a CVD oxide film are formed on the sidewall surfaces of the polysilicon gate electrode 13, and sidewall insulation films 13C and 13D of a CVD SiN film are formed further thereon by a deposition and etch back process. With the formation of such sidewall insulation films, it can be seen that there is formed a depression on the surface of the CVD oxide film 11CVD.

Further, in the step of FIG. 7G, the trenches 11TA and 11TB are formed in the part of the silicon substrate 11 in which the source and drain regions 10c and 10d are to be formed, by an etching process combining a dry etching process and a wet etching process, and with this, the level of the silicon substrate is lowered from the level A of FIG. 6 to the level B.

Further, after formation of the source and drain regions 10c and 10d by an ion implantation process, epitaxial growth of a SiGe mixed crystal layer is conducted according to the condition explained before, and with this, the SiGe mixed crystal regions 11SGA and 11sGB are formed epitaxially in the trenches 11TA and 11TB respectively.

Further, in the steps of FIGS. 7H and 7I conducted concurrently, there is deposited a Ni metallic film on the polysilicon gate electrode 13 and on the SiGe mixed crystal regions 11SGA and 11SGB, and the silicide film 13S is formed on the polysilicon gate electrode 13 and the NiGeSi layers 11SGS are formed on the SiGe mixed crystal regions 11SGA and 11SGB by causing the Ni metal film to react with underlying polysilicon or the SiGe mixed crystal.

With the p-channel MOS transistor thus formed, it can be seen that the thickness of the SiN film 11N accumulating therein the tensile stress is increased locally in the device isolation structures 10I formed at the left and right of the channel region 10CH in correspondence to the parts thereof located adjacent to the channel region 10CH, and the compressive stress applied to the channel region 10CH by the CVD oxide film 11CVD is reduced.

Figure 8:
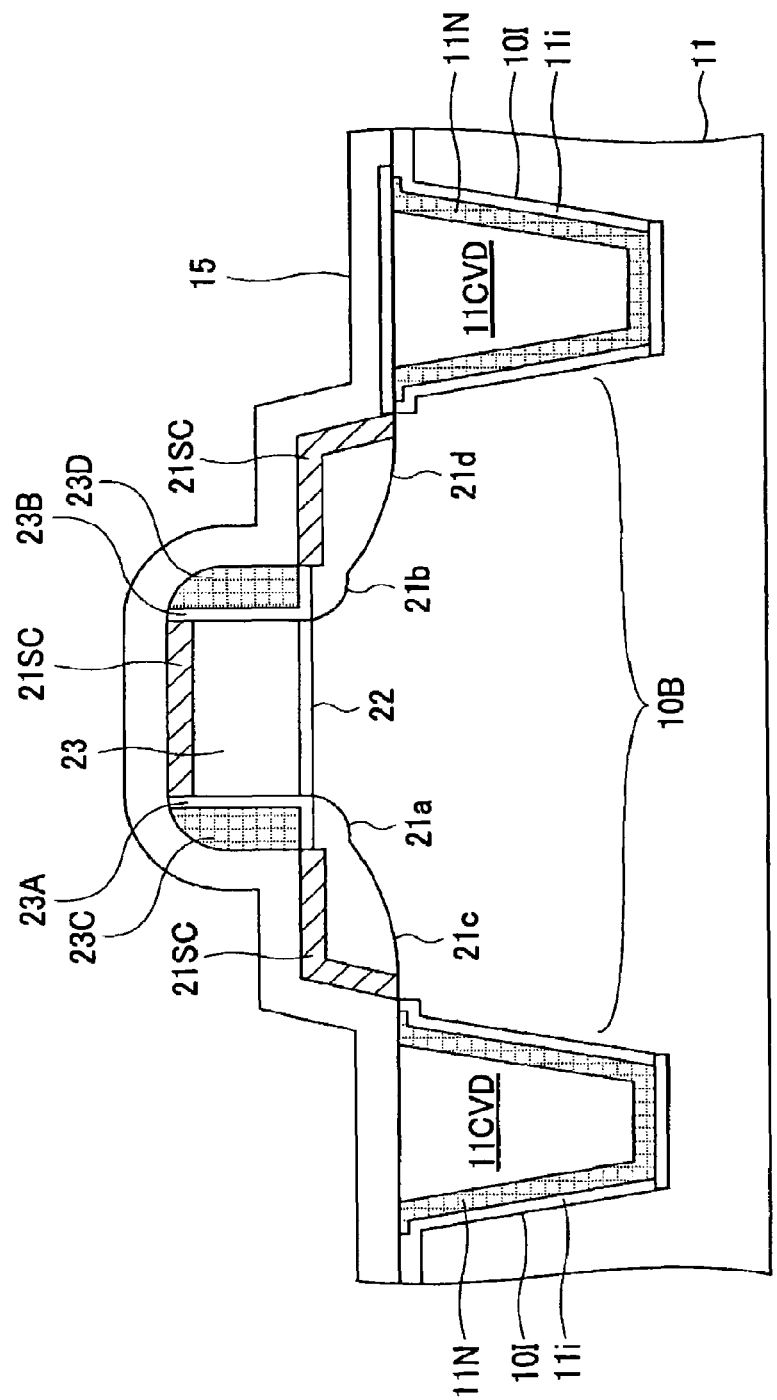
FIG. 8 is a diagram showing the construction of an n-channel MOS transistor integrated on the same silicon substrate with the p-channel MOS transistor of FIG. 3.

FIG. 8 shows the construction of an n-channel MOS transistor 20 formed on the same silicon substrate 11 together with the p-channel MOS transistor of FIGS. 4A-4C.

Referring to FIG. 8, the n-channel MOS transistor 20 is formed in a device region 10B of p$^-$-type defined in the silicon substrate 11 by the device isolation structure 10I and includes an SiON gate insulation film 22 identical with the SiON gate insulation film 12 and formed on the silicon substrate in correspondence to the channel region in the device region 10B, and a polysilicon gate electrode 23 of n$^+$-type formed on the gate insulation film 22, wherein source and drain extension regions 21a and 21b of n-type are formed in the silicon substrate 11 at both lateral sides of the channel region in the device region 10B.

Further, the polysilicon gate electrode 23 has respective sidewall surfaces covered by CVD oxide films 23A and 23B identical with the CVD oxide films 13A and 13B, and SiN insulation films 23C and 23D identical to the SiN sidewall insulation films 13C and 13D are formed at respective outer sides of the CVD oxide films 23A and 23B.

Further, source and drain regions 21c and 21d of n$^+$-type are formed in the silicon substrate 11 in correspondence to the device region 10B at respective outer sides of the SiN sidewall insulation films 23C and 23D, wherein silicide films 21SC are formed on the respective surfaces of the source and drain regions 21c and 21d by a salicide process. Further, the silicide film 21SC is formed also on the polysilicon gate electrode 13.

Further, the n-channel MOS transistor 20 of FIG. 12 is formed with the tensile stress film 15 used with the p-channel MOS transistor 10 of FIGS. 4A-4C on the entire surface thereof, and with this, a biaxial tensile stress is applied to the channel region right underneath the gate electrode. Thereby, the operational speed of the n-channel MOS transistor is improved as compared with the case in which no such application of stress has been made.

Thus, in the case of fabricating a semiconductor integrated circuit carrying the p-channel MOS transistor 10 of FIGS. 4A-4C and the n-channel MOS transistor 20 on a common silicon substrate, the tensile stress film 15 is deposited uniformly on the silicon substrate 11 after formation of the respective device structures on the device regions 10A and 10B, the region where the n-channel MOS transistor 20 has been formed is covered with a resist mask, followed by an etch back process. With this, the tensile stress film 15 is left on the n-channel MOS transistor region and further on the surface forming an angle with respect to the substrate surface in the region of the p-channel MOS transistor.

Further, a compressive stress film 14 is deposited on such a structure uniformly, followed by a removal process removing the compressive stress film 14 from the region of the n-channel MOS transistor. With this, the compressive stress film 14 is left only on the p-channel MOS transistor.

With such a process, it becomes possible to fabricate a semiconductor integrated circuit including a p-channel MOS transistor and an n-channel MOS transistor on a common substrate in which the operational speed is improved in each of the transistors by applying respective stresses, without complicating the fabrication process thereof.

Further, the present invention is not limited to the embodiments described heretofore, but various variations and modifications may be made without departing from the scope of the invention.

What is claimed is:

1. A semiconductor device, comprising:
    a silicon substrate defined with a device region by a device isolation region and including a channel region in said device region;
    a gate electrode formed on said silicon substrate in correspondence to said channel region via a gate insulation film, said gate electrode carrying a pair of sidewall insulation films respectively on a pair of mutually opposing sidewall surfaces thereof;
    source and drain extension regions of p-type formed in said silicon substrate near respective lateral sides of said gate electrode across said channel region;
    source and drain regions of p-type formed in said silicon substrate near respective outer sides of said sidewall insulation films respectively in continuation with said source extension region and said drain extension region;
    a pair of SiGe mixed crystal regions formed near said respective outer sides of said sidewall insulation films epitaxially in said silicon substrate so as to be enclosed respectively by said source region and said drain region, each of said SiGe mixed crystal regions being grown to a level above a level of a gate insulation film interface between said gate insulation film and said silicon substrate, wherein there is provided a compressive stress film on respective top surfaces and sidewall surfaces of said pair of SiGe mixed crystal regions, said compressive stress film causing shrinkage and compressing said pair of SiGe mixed crystal regions when said compressive stress film is formed on said pair of SiGe mixed crystal regions, said pair of SiGe mixed crystal regions exerting a compressive force to said channel region as a result of compressing by said compressive stress film, tensile stress films being formed selectively between the sidewall surfaces of the pair of SiGe mixed crystal regions and the compressive stress film, and not being formed over at least a portion of the top surfaces of the pair of SiGe mixed crystal regions;

wherein the tensile stress films expand the sidewall surfaces of the pair of SiGe mixed crystal regions.

2. The semiconductor device as claimed in claim 1, wherein each of said SiGe mixed crystal regions is higher than said gate insulation film interface by 20 nm or more.

3. The semiconductor device as claimed in claim 1, wherein said tensile stress films have a thickness of 80 nm or less.

4. The semiconductor device as claimed in claim 1, wherein said tensile stress films have a tensile stress of 1 GPa or more.

5. The semiconductor device as claimed in claim 1, wherein said compressive stress film has a compressive stress of 1.5 GPa or more.

6. The semiconductor device as claimed in claim 1, wherein said pair of SiGe mixed crystal regions are formed such that a bottom edge thereof is located near a top level of a device isolation insulator constituting said device isolation region in a cross-sectional diagram including said source region and said drain region.

7. The semiconductor device as claimed in claim 1, wherein said device isolation region forms a shallow trench isolation (STI) structure comprising a device isolation trench formed in said silicon substrate and a device isolation insulator filling said device isolation trench, said device isolation trench carrying, on an inner surface thereof, another tensile stress film having a tensile stress therein, said another tensile stress film having an increased film thickness near both end parts of said channel region as compared with other regions of said another tensile stress film.

8. The semiconductor device as claimed in claim 1, wherein said compressive stress film contains nitrogen and oxygen.

9. The semiconductor device as claimed in claim 1, wherein there is formed an n-channel MOS transistor on said silicon substrate, said n-channel MOS transistor being covered by said compressive stress film over an entirety thereof.

10. The semiconductor device as claimed in claim 1, wherein, in each of said pair of SiGe mixed crystal regions, each of said SiGe mixed crystal regions is formed at a level above an upper surface of the device isolation region.

11. The semiconductor device as claimed in claim 1, wherein the tensile stress films are formed above an upper surface of the device isolation region.

12. The semiconductor device as claimed in claim 1, wherein a boundary between the channel region and the gate insulation film is located higher than a top surface of the device isolation region.

* * * * *